(12) United States Patent
Shippee

(10) Patent No.: US 6,999,537 B2
(45) Date of Patent: Feb. 14, 2006

(54) METHOD OF REMOVING DC OFFSET FOR A ZIF-BASED GSM RADIO SOLUTION WITH DIGITAL FREQUENCY CORRELATION

(75) Inventor: Geoffrey Shippee, La Jolla, CA (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 10/454,395

(22) Filed: Jun. 3, 2003

(65) Prior Publication Data

US 2004/0082302 A1   Apr. 29, 2004

Related U.S. Application Data

(60) Provisional application No. 60/421,223, filed on Oct. 25, 2002.

(51) Int. Cl.
*H04B 1/10* (2006.01)
(52) U.S. Cl. .................................................. 375/346
(58) Field of Classification Search ................. 375/316, 375/319, 322, 326, 346, 350; 370/206; 455/296, 455/196.1, 207, 216, 232.1, 266, 278.1, 324
See application file for complete search history.

(56) References Cited

U.S. PATENT DOCUMENTS 5,805,478 A * 9/1998 Kim ............................ 708/323
6,009,126 A * 12/1999 Van Bezooijen ............ 375/319
6,868,128 B1 * 3/2005 Lane .......................... 375/319
2003/0058965 A1 * 3/2003 Ezquerra-Moreu et al. .. 375/319
2003/0174641 A1 * 9/2003 Rahman ..................... 370/206

FOREIGN PATENT DOCUMENTS

| DE | 19933266 | 11/2000 |
|---|---|---|
| WO | 0069023 | 11/2000 |
| WO | 02056490 | 7/2002 |
| WO | 02067420 | 8/2002 |

* cited by examiner

*Primary Examiner*—Don N. Vo
(74) *Attorney, Agent, or Firm*—Philip R. Wadsorth; Charles D. Brwon; Kenyon S. Jenckes

(57) ABSTRACT

Disclosed is a method and apparatus for removing DC offsets in a ZIF radio device, the method including the steps of converting a signal to digital samples, calculating a DC burst by capturing an entire burst and a portion of the adjacent channels, removing DC offset from the digital signal, rotating out frequency error from the digital signal, and performing channel filtering of the digital signal. The system includes a digital DC offset removal circuit, which includes an analog to digital converter, a channel filter connected to the converter, and a rotator system that is connected to the channel filter input and output. The rotator system includes a DC estimator connected to the channel filter input, a DC offset removal component connected to the DC estimator, and a rotator connected to the DC offset removal component, the output of the rotator being connected to the channel filter input.

12 Claims, 8 Drawing Sheets

| STAGE INDEX | ROTATION ANGLE |
|---|---|
| 0 | 45 |
| 1 | 26.565 |
| 2 | 14.036 |
| 3 | 7.125 |
| 4 | 3.576 |
| 5 | 1.790 |
| 6 | .895 |
| 7 | .448 |
| 8 | .224 |
| 9 | .112 |
| 10 | .056 |

FIG. 2

METHOD OF REMOVING DC OFFSET FOR A ZIF-BASED GSM RADIO SOLUTION WITH DIGITAL FREQUENCY CORRELATION

CROSS-REFERENCE TO RELATED APPLICATIONS

This application claims the benefit of U.S. Provisional Application No. 60/421,223, filed Oct. 25, 2002.

BACKGROUND

1. Technical Field

The disclosure relates to zero intermediate frequency (ZIF) based radio solutions and, more particularly, to a method and apparatus for removing DC offset in a ZIF based radio when digital frequency correction is utilized.

2. Related Art

ZIF based radio receivers receive radio frequency (RF) signals that are applied to quadrature mixers which multiply the signal at a frequency generated by a local oscillator (LO). The in-phase signal or I-channel and the quadrature signal or Q-channel are generated by the LO. The LO input down converts the RF signals modulated on a common carrier frequency. The mixers yield outputs that contain both sum frequency components and difference frequency components around zero frequency. DC filters eliminate the sum frequency components and accept the difference frequency components. The zero frequency components are then amplified by low level frequency amplifying stages. The ZIF receiver eliminates interim conversion to an intermediate frequency by converting the incoming signal directly to baseband in a single operation.

ZIF based radio receivers, however, generate DC offset that can be much greater than the desired signal. Low level frequency amplifiers can be saturated by large DC offsets before the desired signal is amplified. Therefore, wireless communication systems that utilize ZIF radios have to overcome large DC offsets in the baseband signal. The DC offset should be removed before the frequency correction of the received baseband signal can be performed, or the signal will turn into a tone at frequency correction with the AFC loop correcting the DC offset. In a GSM receiver, since the bandwidth is relatively small, any significant frequency offset must be performed prior to the final channel filtering. Therefore, what is needed is an efficient way to remove DC offset in ZIF based radio receivers.

SUMMARY

The disclosed method and apparatus provide a digital baseband solution that provides flexibility to accept demodulated waveforms from a radio receiver without any, or relatively little, DC offset. This allows significant reduction in the complexity of the ZIF radio receiver's DC offset removal system since the majority of the DC offset is removed by the digital baseband, allowing digital processing to remove the DC offset.

In the present disclosed method and apparatus, DC offset in a GSM radio network is removed by capturing an adequate number of samples of the burst, or the entire burst, plus a relatively significant portion of the adjacent channels. The samples of the burst or the entire burst are used to calculate the DC offset in the burst, then the DC offset is removed, then frequency correction is made, then channel filtering is performed.

The method disclosed includes the steps of converting a signal to digital samples, calculating a DC burst by capturing samples of the burst or an entire burst and a portion of the adjacent channels, removing DC offset from the digital signal, rotating out frequency error from the digital signal, and performing channel filtering of the digital signal. The system disclosed includes a digital DC offset removal circuit, which includes an analog to digital converter, a channel filter connected to the converter, and a rotator system that is connected to the channel filter input and output. The rotator system includes a DC estimator connected to the channel filter input, a DC offset removal component connected to the DC estimator, and a coordinate rotation digital computer (CORDIC) rotator connected to the DC offset removal component, the output of the CORDIC rotator being connected to the channel filter input.

BRIEF DESCRIPTION OF THE DRAWINGS

The disclosure will now be described in greater detail with reference to the embodiments illustrated in the accompanying drawings, in which like elements bear like reference numerals, and wherein:

FIG. 2 illustrates the angle of rotation of each sample of data according to the present disclosure;

DETAILED DESCRIPTION

Disclosed is a method of correcting DC offset in a ZIF-based radio device. The ZIF-based radio device can be any communications device useable on any communications system. For example, in one implementation the ZIF-based radio device can be a GSM radio receiver. In another implementation, the ZIF-based radio device can be a CDMA radio receiver.

In the GSM implementation, the GSM receiver may be used with either a Voltage Controlled Temperature Controlled Crystal Oscillator (VCTCXO) or a Temperature Compensated Crystal Oscillator (TCXO); however, when not using a VCTXO, rotators are required to compensate for frequency drift during operation. According to the present disclosure, a complex I/Q (in-phase/quadrature) pair rotator, such as a CORDIC (COordinate Rotation DIgital Computer) rotator by way of example, is used to reduce the local area and complexity of the rotator.

A GMSK modulator selects between the GMSK modulator's I/Q data stream and the rotated stream through the Modltr_config register. The channel filter provides the rotator with 15-bit I/Q data to be rotated at OSR2 and data_valid signals, which indicate valid data.

Figure 1:
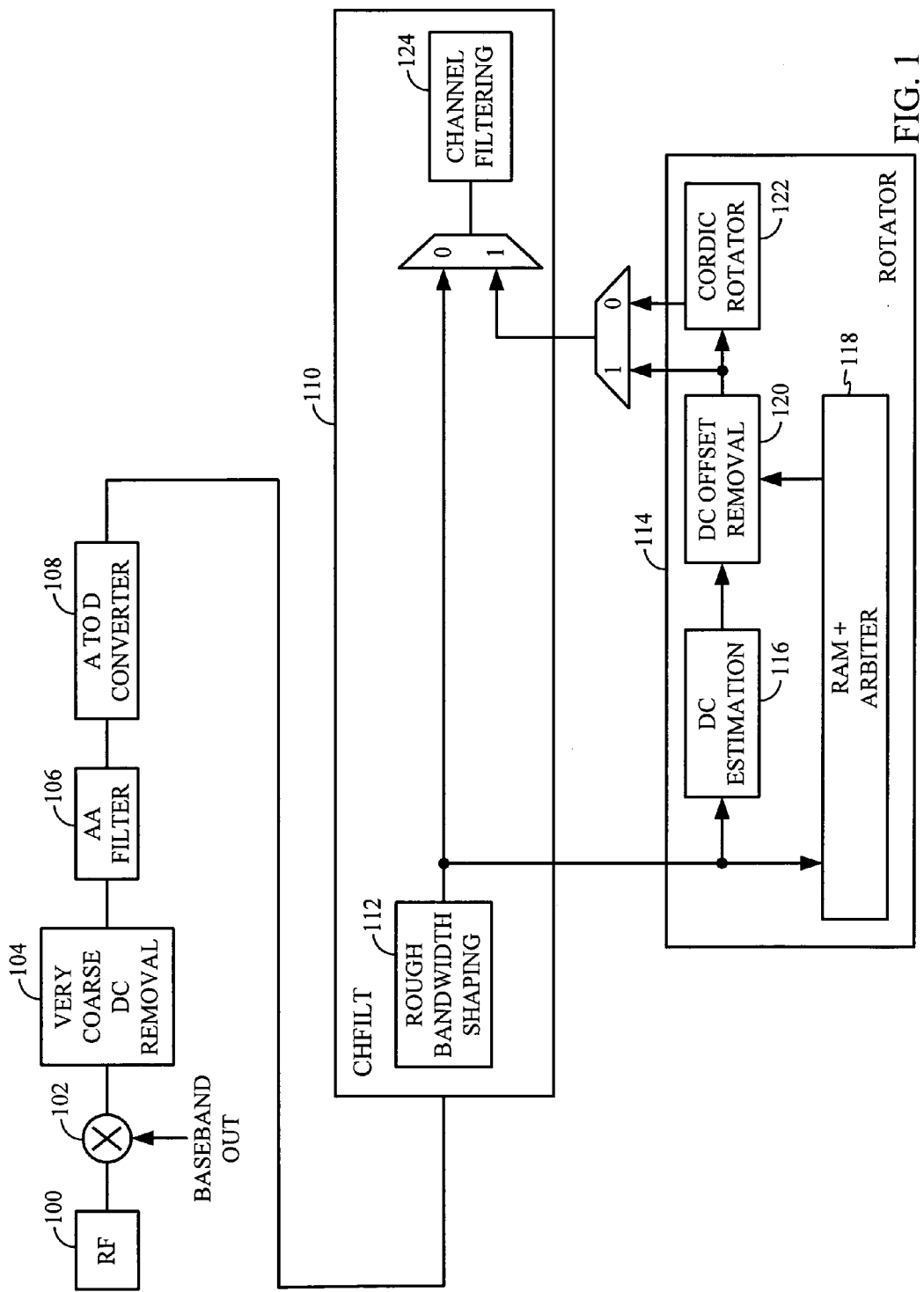
FIG. 1 illustrates a receive rotator path block diagram according to the present disclosure.

FIG. 1 illustrates the data path from the channel filter through the DC offset removal, rotation, and then back to the channel filter. An exemplary circuit includes RF 100 connected to a mixer 102. Next, a very course DC removal is performed on the signal at filter 104. Next, an anti-alias filter knocks off the edges of the signal at 106, and an analog to digital converter 108 converts the analog signal to a digital signal and feeds the signal to channel filter 110. The channel filter 110 includes a rough bandwidth shaping component 112. Connected to the channel filter 110 is rotator 114. The rotator 114 includes a DC estimator 116, a RAM and arbiter 118, which is connected to a DC offset removal component 120. The output of the DC offset removal component 120 is a CORDIC rotator 122. The resulting data signal is then feed into channel filter 124. The data received from stage two of the channel filter is stored in local RAM or other storage means, which is located in the rotator system, or alternatively, elsewhere in the system. The rotator system includes RAM+Arbiter, a DC estimator, DC offset removal component, and the I/Q pair rotator. After data is stored in the local RAM, DC estimation is performed, in one embodiment, on a slight number of I/Q pairs of data. Once the DC estimation is complete, the data is read from the RAM and the DC offset is removed. The I/Q pair samples are then located and returned to the channel filter. The very coarse DC removal component limits the exposure of the analog to digital converter to extreme DC biases. The DC offset removal can be determined at a calibration phase of building the wireless device, does not have to be dynamic, and can be implemented utilizing simple networks.

The I/Q pair rotator operates within an iterative algorithm that utilizes only shifts and adds to generate the vector rotation. A counterclockwise vector rotation is represented as:

$$I_{rot} + jQ_{rot} = (I + JQ)e^{j(\Delta)}$$ where $\Delta$ is the angle of rotation.

$$I_{rot} = I\cos(\Delta) - Q\sin(\Delta)$$

$$Q_{rot} = Q\cos(\Delta) + I\sin(\Delta)$$

Rearranging the terms we get:

$$I_{rot} = \cos(\Delta)(I - Q\tan(\Delta))$$

$$Q_{rot} = \cos(\Delta)(Q - I\tan(\Delta))$$

Represent $\Delta = \Sigma d_i \delta(i)$ where each slice $\delta(i) = \arctan(\frac{1}{2}^i)$ and $d_i = +1$ or $-1$. Thus rotation by any angle can be made possible by performing rotation by consecutive rotations of fixed and smaller angles. A decision to be made is whether to add or subtract the fixed angle. Each iteration consists of the following:

$$I_{i+1} = K_i(I_i - d_i Q_i / 2^i)$$

$$Q_{i+1} = K_i(Q_i - d_i Q_i / 2^i)$$

Division by $2^i$ is achieved by right shifting by i bits or truncation of the i least significant bits. Thus, the result is obtained by a series of shifts and adds. The term $K_j$ is the gain of the system and is equal to $\Pi(1/\cos(\arcan(\frac{1}{2}^i)))$, for which i>5, the value converges to 1.647.

The angle of rotation for each sample of data, as shown in FIG. 2, is caused specifically by the I/Q pair rotator.

The maximum phase error of the result is dictated by the number of the stages in the rotator. On the receive path, the DC component of the I/Q samples must be removed prior to rotation. Rotating the I/Q pairs with DC offset will introduce both phase error and gain error. The DC offset is calculated by averaging over a number of samples. A number of samples used for this calculation may vary depending on the type of burst.

The rotator cell provides frequency error within 0.1 ppm of the base station carrier frequency. The rotator provides a phase error of less than 0.895 degrees on the receiver and less than 0.056 degrees on the transmitter. The rotator rotates for transmit rotation, and for receive rotation. The rotator removes the DC offset from the received path as further disclosed below. The rotator rotates the digital I/Q data on both the receive and transmit paths. In the present disclosure, GSM/GPRS modes are supported. The physical rotator may be shared by both the transmit and the receive paths.

The disclosed method introduces a slight delay to the baseband demodulation. For a typical received burst, there are a number of samples required to generate a valid DC estimate, of which most of the symbols generate the offset and the first symbols are used to center the DC estimation about the center of the burst. The rx burst will arrive in DCP memory at some time measurement, measured in X $\mu$s. For example, an 80 symbol receive monitor burst, in which all 80 symbols are required for DC estimation, the rx burst will arrive in DSP memory 16 $\mu$s delayed.

In an alternative embodiment, the DC offset will be supplied by the microprocessor using an algorithm which averages the DC offset for several bursts. In this embodiment, very little delay is introduced to the firmware.

The use of the I/Q pair or CORDIC rotator to compensate for the removal of a frequency error that is the result of using an uncontrolled XO in a GSM transmitter and receiver provides an alternative to a DDS rotator, since the rotator provides a simpler design and does not require any multipliers. In this design, the transmitter may have a stage rotator with a bit phase accumulator, and the receiver may have a stage rotator with a bit phase accumulator.

The output of the analog to digital converter is 24 times over-sampled, for example, but any number greater than 4 would be sufficient. The rotator is inserted after the second decimation at OSR=2. At the final output, the frequency response is too narrow to correct for a large frequency offset. The frequency response up to the second decimation is wide enough so that a correction can be made for at least 20-Hz of frequency offset.

In one embodiment, assuming that the objectives are to be within 0.1 ppm to the base station carrier frequency and also assuming a carrier frequency of 900-MHz, requires the receiver to be within 90-Hz of the base station frequency. Since the rotation is done at the sampling rate of 2 s/sec, or $f_s = 541.67$ kHz, a 14-bit phase accumulator will have a sufficient frequency resolution of $fs/2^{14} = 33.1$ Hz. The number of stages in the rotator is primarily dictated by the amount of phase error and spurs caused by the rotator. Simulations have shown that a 7 stage rotator introduces 0.5 degrees of rms phase error and the spurs are more than 46 dB down.

Figure 3:
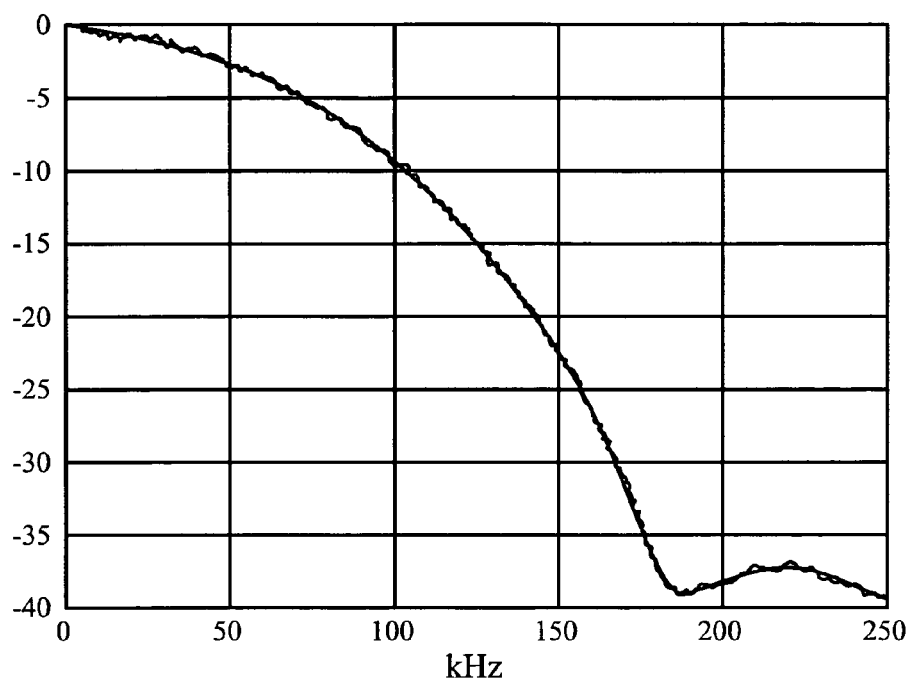
FIG. 3 illustrates the spectra of the input and output of the CORDIC transmitter with the input being a GSM signal.

FIG. 3 illustrates the spectra of the input and output of the CORDIC transmitter with the input being a GSM signal, and illustrating that the spectra for the input and the output are virtually identical.

The input of the rotator, which is the output of the second decimation filter, is 15-bits, by way of example. The rotator has a gain of a certain amount, for example, by 1.6468 and, therefore, it increases the bit-width by one bit. Therefore, one bit at the output of the rotator is truncated and the remaining 15-bits go to the final decimation filter. Since the rotation is done at a relatively low sampling rate, only one stage needs to be implemented in hardware and the same circuitry may be used to do all the stages of rotation successfully.

Further, by way of example, the sampling rate at the transmitter is 13-mHz. Therefore, to have a similar frequency resolution more bits in the phase accumulator are required. A 19-bit phase accumulator will have a sufficient frequency resolution of $f_s/2^{19} = 24.8$ Hz. The number of stages in the rotator is dictated by the amount of phase error and spurs caused by the rotator. Simulations have illustrated that an 11-stage rotator introduces 0.03 degrees of RMS phase error, of which 0.2 degrees is budgeted for the baseband, and the spurs are more than 80 dB down.

Figure 4:
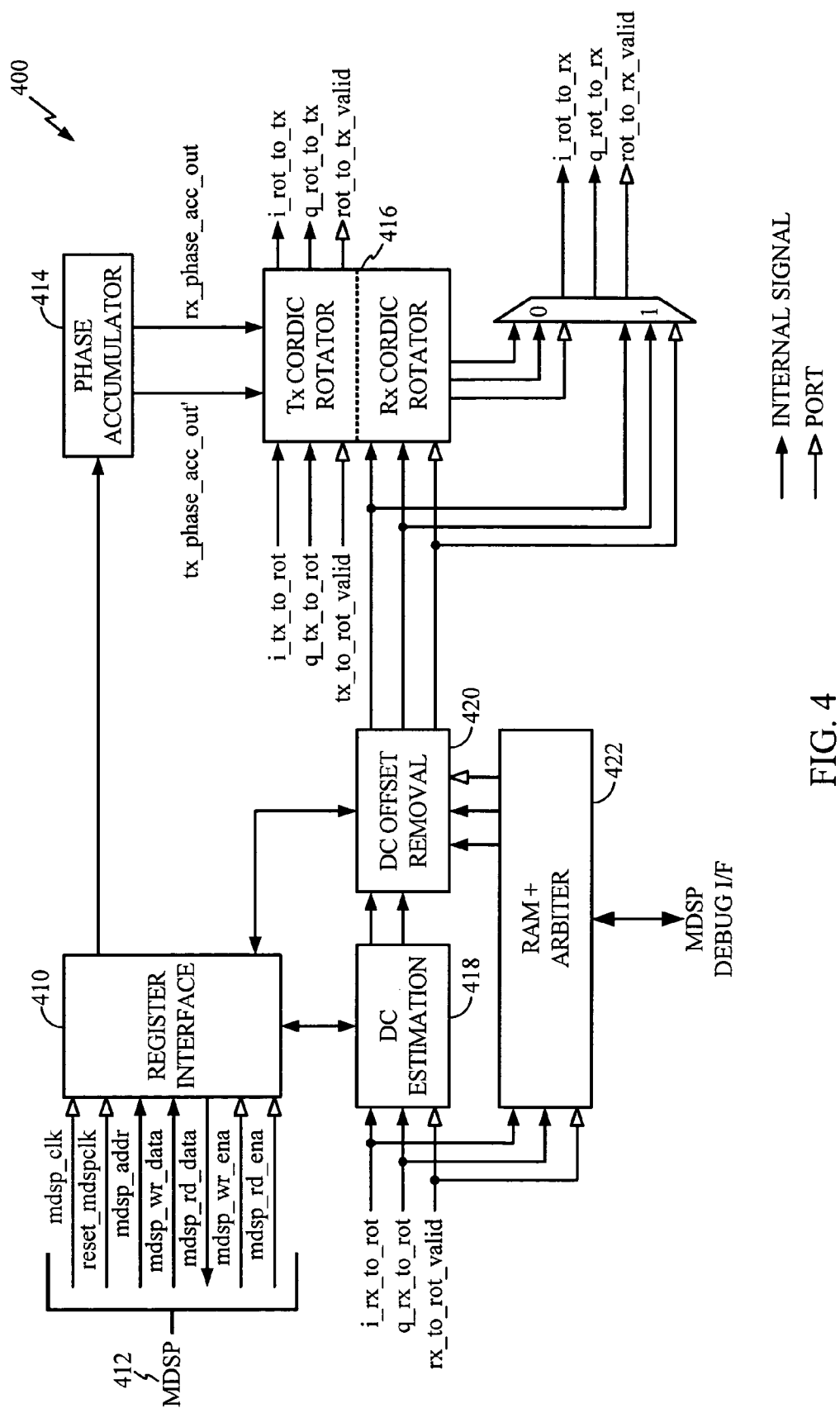
FIG. 4 illustrates a top level block diagram of the rotator according to the present disclosure.

The top level connections of the rotator 400 are depicted in FIG. 4 and, by example, the rotator consists of six blocks. A register interface 410 allows the ARM and/or a MDSP 412 to program the registers necessary for rotation and DC offset removal. A phase accumulator 414 includes two phase accumulators and a CORDIC rotator 416 consisting of two unrolled CORDIC rotators. In addition, two separate rotators are used for rotation functions. A DC estimation block 418 and DC offset removal block 420 calculate and then remove the DC offset, respectively, from the incoming I/Q samples. A RAM+Arbiter block 422 holds the RAM that is used to store the I/Q samples until a valid DC offset has been calculated. The RAM+Arbiter 422 also controls the flow of the data through the circuit.

The transmit phase accumulator rotates at a certain amount to allow for incrementing by phase_offset. The receive phase accumulator rotates every valid I/Q data pair a value of (24)*(phase_offset). This may allow programming of one register to control both phase accumulators. The phase_offset can be programmed by either the MDSP or the ARM. Selection between the two possible phase increment commands is controlled by the ARM. It is assumed that phase_offset will be changed before any rotation is going to occur and, therefore, no synchronization circuit is required before the phase_offset register and the receive phase accumulator.

The DC removal circuit consists of three elements, including the DC estimator 418, the DC offset removal 420 and the RAM 422. The DC estimator 418 will generate an average DC value for the selected I/Q samples. The DC offset removal 420 will remove or, in the alternative, will greatly minimize, the DC component from the I/Q data, and the RAM 422 will store the I/Q samples until a valid DC value has been calculated. The receive rotator removes the DC component of the data before rotation.

Figure 5:
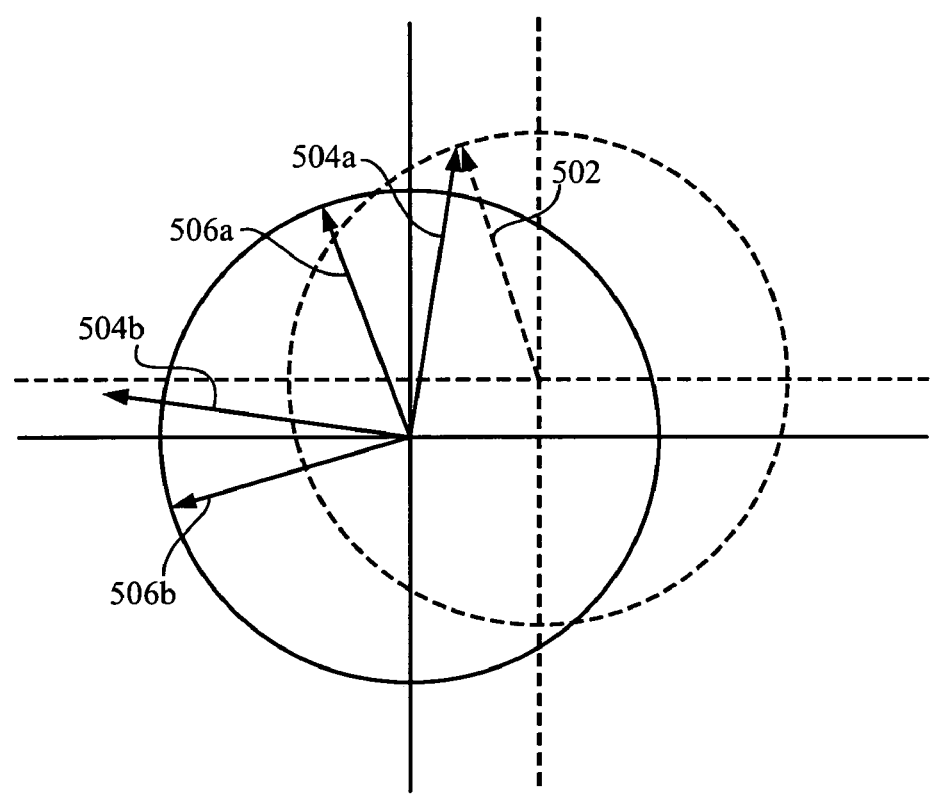
FIG. 5 illustrates the error due to rotating I/Q with a DC component.

FIG. 5 illustrates an example of the errors that may be created when rotating I/Q data with a DC component. A DC offset vector 502 is shown with the dashed lines. Ideally, with the DC offset removed, the I/Q pair 506*a* and 506*b* which lies in quadrant 2, will be rotated by 90 degrees to be relocated in quadrant 3. Nevertheless, due to the DC offset, the I/Q pairs 504*a* and 504*b* appear to be in quadrant 1 and would result in being rotated into quadrant 2. This rotation also increases a variable gain factor during rotation.

The DC estimator estimates the average of the incoming samples by summing the individual I/Q samples over a user specified period. The DC estimator then divides over the number of samples. The period is not fixed due to the different types of bursts. The user can define a number of samples to sum and define the number of samples to skip before beginning the summation step. The order of sum followed by the divide step is utilized since the divide circuitry can be simplified if it has to be performed once per burst as opposed to once per valid I/Q pair. During GPRS, when there are consecutive Rx bursts, only one DC calculation is required.

Once the DC offset has been calculated, the DC estimator triggers the RAM+Arbiter to begin sending I/Q data to the DC offset removal block. The DC offset removal then subtracts the DC values from the incoming I/Q data pairs, and passes the result to the rotator. In an alternative embodiment, the DC offset removal in the quadrant rotation portions of the rotator are merged to reduce logic requirements.

Figure 6:
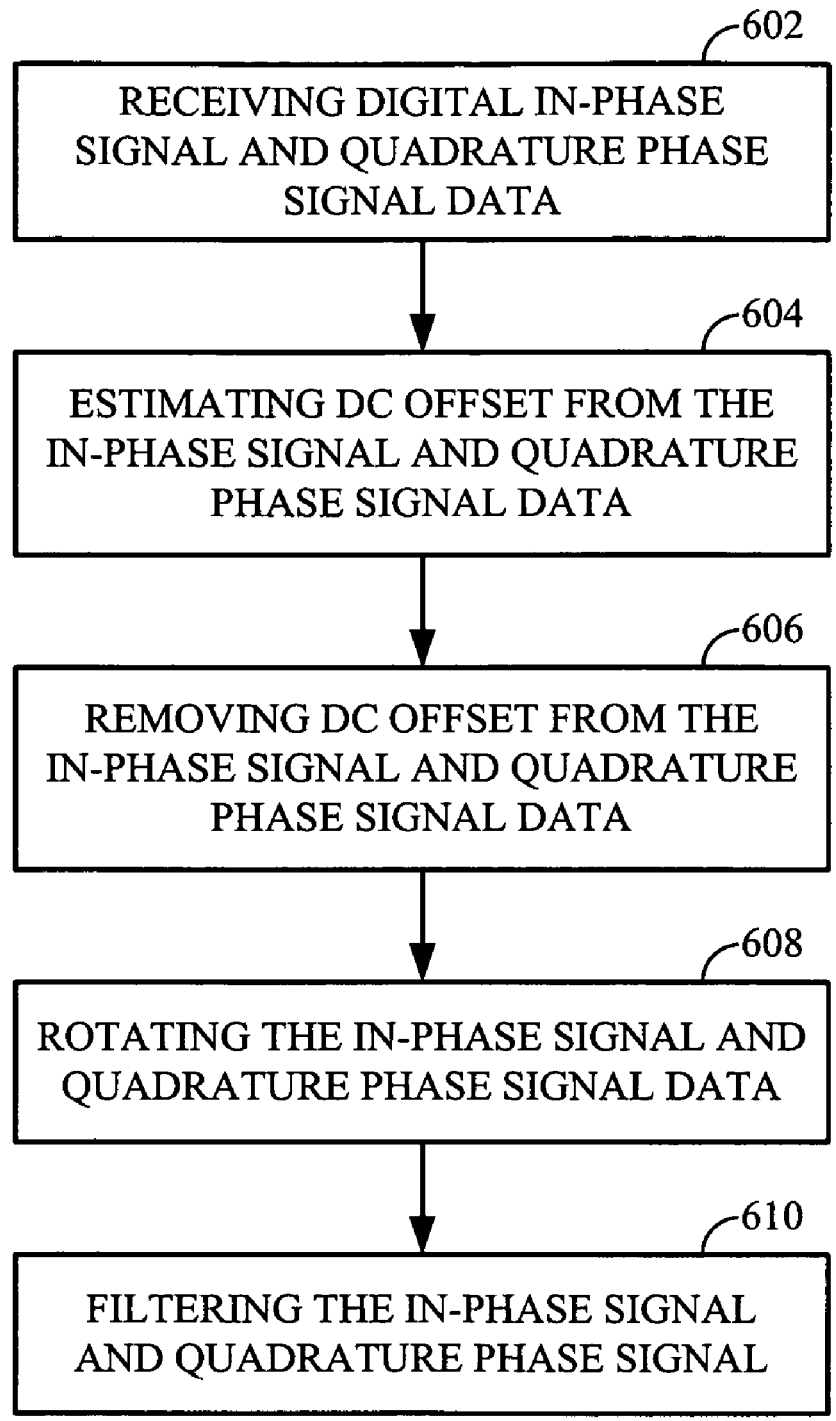
FIGS. 6–7 illustrate methods for correcting for and removing DC offset in a ZIF based radio device.
Figure 6A:
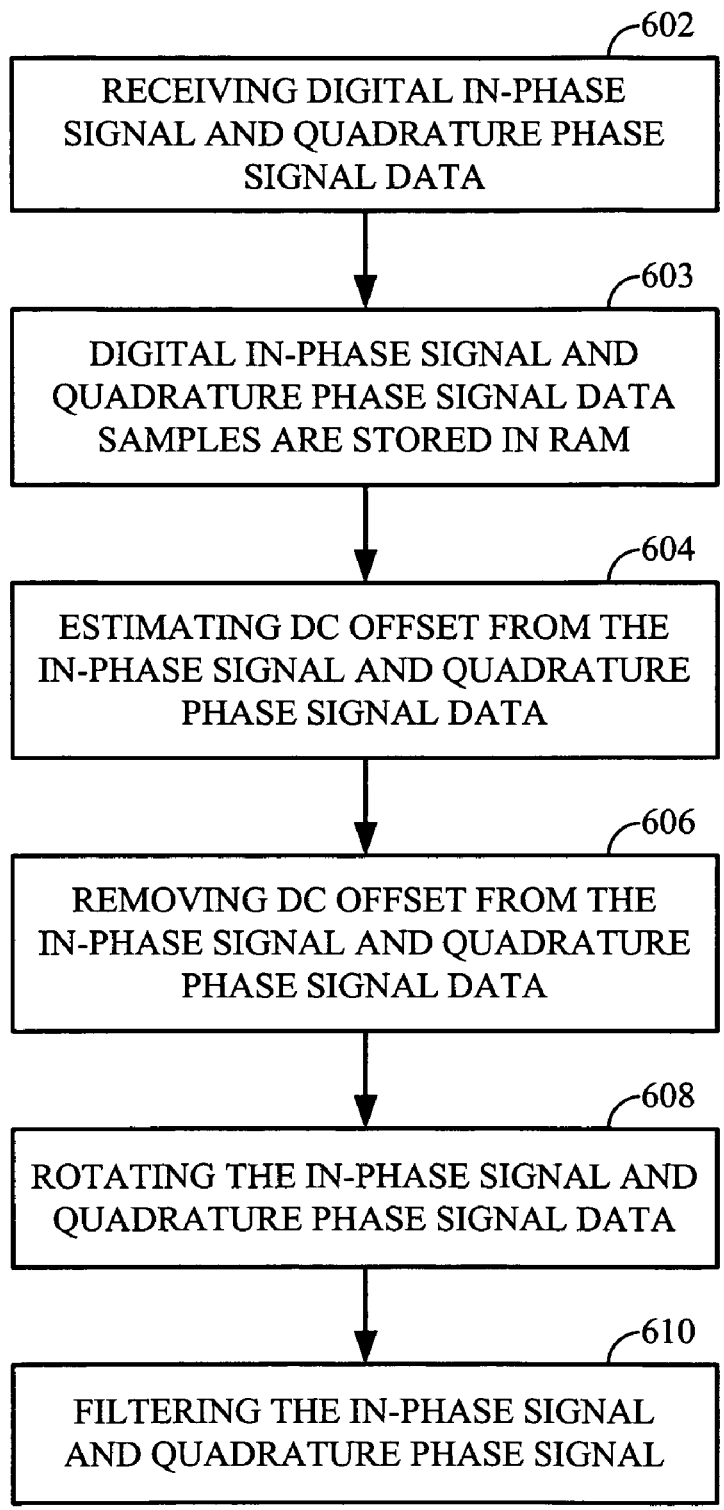

FIG. 6 illustrates an exemplary method of correcting for DC offset in a ZIF based radio device according to the present disclosure. The method includes the steps of receiving digital in-phase signal and quadrature phase signal data, as shown in step 602. Then, the step of estimating DC offset from the in-phase signal and quadrature phase signal data is performed, as shown in step 604. Next, the step of removing the DC offset from the in-phase signal and quadrature phase signal data, as shown in step 606, is performed. Then, the step of rotating the in-phase signal and the quadrature phase signal data is performed, as shown in step 608. Then, the step of filtering the in-phase signal and the quadrature phase signal as shown in step 610 is optionally performed. In an alternative embodiment, as shown in FIG. 6*a*, a method of correcting for DC offset in a ZIF based radio device is shown, wherein the method is generally the same as the method shown in FIG. 6, except step 603 is added, wherein digital in-phase signal and quadrature phase signal data samples are stored in a storage means, such as RAM, before the DC offset is estimated at step 604.

Figure 7:
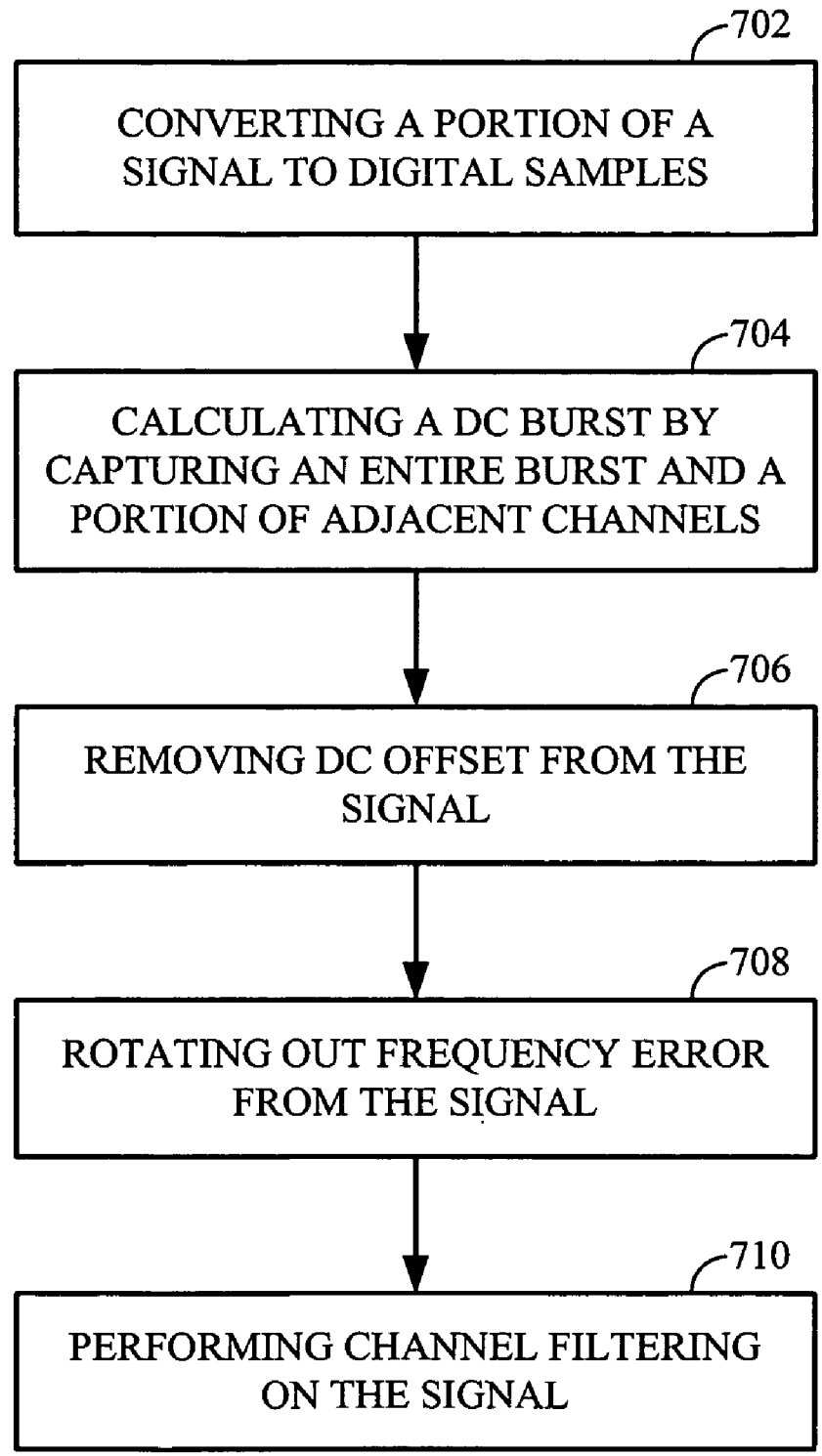

FIG. 7 illustrates a method of removing DC offset in a ZIF based radio device according to the present disclosure. The method includes the steps of converting a portion of a signal to digital samples, as shown in step 702. Then, the step of calculating a DC burst by capturing an entire burst and a portion of adjacent channels is performed, as shown in step 704. Next, the step of removing DC offset from the signal is performed, as shown in step 706. Then, the step of rotating out frequency error from the signal is performed, as shown in step 708. Next, the step of performing channel filtering is performed, as shown in step 710.

The disclosed method and apparatus provide a digital baseband solution that provides flexibility to accept demodulated waveforms from a radio receiver without any, or relatively little, DC offset. This allows significant reduction in the complexity of the ZIF radio receiver's DC offset removal system since the majority of the DC offset is removed by the digital baseband, allowing digital processing to remove the DC offset.

The previous description is provided to enable any persons skilled in the art to make or use the present disclosure. The various modifications to these embodiments will be readily apparent to those skilled in the art, and the generic principles defined herein may be applied to other embodiments without the use of the inventive faculty. Thus, the present disclosure is not intended to be limited to the embodiments shown herein, but is to be accorded the right of scope consistent with the principles and novel features disclosed herein.

What is claimed is:

1. A method of removing DC offset in a ZIF based radio device, comprising the steps of:
    convening a portion of a signal to digital samples;
    calculating a DC burst by capturing an entire burst and a portion of adjacent channels;
    removing DC offset from the signal;
    rotating out frequency error from the signal; and
    performing channel filtering on the signal.

2. The method of claim 1, wherein the DC offset is removed from the signal by a rotator system.

3. The method of claim 2, wherein the rotator system comprises a DC estimator, a DC offset removal component, and a CORDIC rotator.

4. A ZIF radio device, comprising:
    an analog to digital converter;
    a channel filter connected to the analog to digital converter;

a rotator system connected to the channel filter;
the rotator system, comprising:
  a DC estimator connected to the channel filter;
  a DC offset removal component connected to the DC estimator; and
  a CORDIC rotator connected to the DC offset removal component, the output of the CORDIC rotator being connected to the channel filter.

5. The ZIF radio device of claim 4, wherein the DC offset removal component removes DC offset in the ZIF radio device.

6. The ZIF radio device of claim 4, further comprising a coarse DC removal component prior to the rotator system.

7. The ZIF radio device of claim 4, wherein the ZIF radio device further comprises a ZIF down converter.

8. A ZIF radio device, the device comprising:
  an analog to digital converter (ADC) configured to receive analog in-phase and quadrature signal data and generate digital in-phase and quadrature phase signal data;
  a storage device coupled to the ADC and configured to store a predetermined amount of digital in-phase and quadrature phase signal data;
  a DC estimator coupled to the ADC and configured to generate an estimated DC offset of the digital in-phase and quadrature phase signal data;
  a DC offset from the digital in-phase and quadrature phase signal data stored within the storage device based on the estimated DC offset; and
  a coarse DC removal component coupled to the ADC and configured to remove at least a portion of the DC offset from the analog in-phase and quadrature phase signal data.

9. The device of claim 8, further comprising a rotator coupled to the DC offset removal component and configured to rotate the digital in-phase and quadrature phase signal data to generate rotated in-phase and quadrature phase signal data.

10. The device of claim 9, further comprising a channel filter coupled to the rotator and configured to filter the rotated in-phase and quadrature phase signal data.

11. The device of claim 8, wherein the predetermined amount of digital in-phase and quadrature phase signal data comprises an entire data burst.

12. The device of claim 8, wherein the DC estimator is configured to generate the estimated DC offset based in part on an average DC value of the predetermined amount of digital in-phase and quadrature phase signal data stored in the storage device.

* * * * *